(12) United States Patent
Chen et al.

(10) Patent No.: US 9,269,704 B2
(45) Date of Patent: Feb. 23, 2016

(54) SEMICONDUCTOR DEVICE WITH EMBEDDED SILICON-CONTROLLED RECTIFIER

(71) Applicant: Nuvoton Technology Corporation, Hsinchu (TW)

(72) Inventors: Po-An Chen, Hsinchu (TW); Md Imran Siddiqui, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 117 days.

(21) Appl. No.: 14/040,745

(22) Filed: Sep. 30, 2013

(65) Prior Publication Data

US 2014/0027811 A1   Jan. 30, 2014

Related U.S. Application Data

(63) Continuation-in-part of application No. 13/471,469, filed on May 15, 2012, now Pat. No. 8,587,057.

(30) Foreign Application Priority Data

Sep. 12, 2013   (TW) .............................. 102132981 A

(51) Int. Cl.
| | |
|---|---|
| *H01L 27/02* | (2006.01) |
| *H01L 29/423* | (2006.01) |
| *H01L 29/74* | (2006.01) |
| *H01L 29/06* | (2006.01) |

(52) U.S. Cl.
CPC ........ *H01L 27/0262* (2013.01); *H01L 29/7436* (2013.01); *H01L 29/0634* (2013.01); *H01L 29/0692* (2013.01); *H01L 29/42368* (2013.01)

(58) Field of Classification Search
None
See application file for complete search history.

(56) References Cited

U.S. PATENT DOCUMENTS

| | | | |
|---|---|---|---|
| 5,258,636 A * | 11/1993 | Rumennik | .......... H01L 29/0634 257/339 |
| 5,633,521 A | 5/1997 | Koishikawa | |
| 6,137,140 A | 10/2000 | Efland et al. | |
| 6,207,994 B1 | 3/2001 | Rumennik et al. | |
| 6,258,634 B1 * | 7/2001 | Wang | .................. H01L 27/0262 148/335 |

(Continued)

FOREIGN PATENT DOCUMENTS

| | | |
|---|---|---|
| CN | 101030603 A | 9/2007 |
| CN | 101814524 A | 8/2010 |

(Continued)

OTHER PUBLICATIONS

"700V Lateral DMOS with New Source Fingertip Design", by S.H. Lee, C.K. Jeon, J.W. Moon, Y.C. Choi., 2008 IEEE, pp. 141-144.

(Continued)

*Primary Examiner* — Steven Loke
*Assistant Examiner* — Juanita Rhodes
(74) *Attorney, Agent, or Firm* — CKC & Partners Co., Ltd.

(57) ABSTRACT

A semiconductor device includes a metal-oxide-semiconductor field effect transistor (MOSFET), in which parasitic silicon controlled rectifier (SCR) equivalent circuits are formed in the MOSFET, and the MOSFET further includes a drain region. The drain region includes P-type heavily doped regions which are different from each other, in which the P-type heavily doped regions are respectively operated as anodes of the SCR equivalent circuits.

14 Claims, 13 Drawing Sheets

(56) References Cited

U.S. PATENT DOCUMENTS

| | | |
|---|---|---|
| 6,614,077 B2 | 9/2003 | Nakamura et al. |
| 6,720,624 B1* | 4/2004 | Vashchenko ........ H01L 27/0262 257/141 |
| 7,323,747 B2 | 1/2008 | Ikuta et al. |
| 7,414,287 B2 | 8/2008 | Pendharkar et al. |
| 7,800,167 B2 | 9/2010 | Kitamura et al. |
| 8,133,789 B1* | 3/2012 | Cooper ................ H01L 21/046 257/327 |
| 2007/0034956 A1* | 2/2007 | Lee .................... H01L 27/0262 257/355 |
| 2007/0096174 A1* | 5/2007 | Higuchi .............. H01L 27/0629 257/288 |
| 2008/0079072 A1* | 4/2008 | Lee .................... H01L 29/7835 257/335 |
| 2008/0197418 A1 | 8/2008 | Parthasarathy et al. |
| 2009/0315113 A1* | 12/2009 | Vashchenko ........ H01L 27/0262 257/355 |
| 2010/0301411 A1* | 12/2010 | Takeda ................ H01L 29/0696 257/335 |
| 2011/0042747 A1* | 2/2011 | Galy ................... H01L 27/0262 257/360 |

FOREIGN PATENT DOCUMENTS

| | | |
|---|---|---|
| EP | 1286399 B1 | 3/2008 |
| TW | 506132 B | 10/2002 |
| TW | 201011913 | 3/2010 |

OTHER PUBLICATIONS

"The impact of N-drift implant on ESD robustness of high voltage NMOS with embedded SCR structure in 40V CMOS process", by WJChang et al., IPFA 2007, pp. 249-252.

Improvement in Lateral IGBT Design for 500V 3A One Chp Inverter ICs by A. Nakagawa, H. Funaki, Y. Yamaguchi and F. Suzuki, 1999 IEEE, pp. 321-324.

* cited by examiner

SEMICONDUCTOR DEVICE WITH EMBEDDED SILICON-CONTROLLED RECTIFIER

RELATED APPLICATIONS

This application is a continuation-in-part of U.S. application Ser. No. 13/471,469, filed May 15, 2012, and this application also claims priority to Taiwan Patent Application Ser. No. 102132981, filed Sep. 12, 2013. The aforementioned applications are hereby incorporated herein by reference.

BACKGROUND

1. Technical Field

The present disclosure relates to a semiconductor device. More particularly, the present disclosure relates to a semiconductor device having silicon controlled rectifier (SCR) equivalent circuits.

2. Description of Related Art

Conventionally, there is an electrostatic discharge (ESD) protection mechanism set in various electronic devices, so as to prevent the electronic device from being damaged due to a momentary large current generated when a human body carrying too many electrostatic charges touches the electronic device, or to prevent the electronic device from being affected by electrostatic charges existing in the environment or carried by transportation and from being abnormally operated.

However, the ESD protection mechanism in the conventional electronic device usually needs a larger layout area to be able to conduct a larger ESD current. In other words, in a condition of a constant layout area, the conducted ESD current is not sufficiently large, and the conducted ESD current cannot be uniformly distributed, such that the ESD protection mechanism cannot effectively perform protection to the electronic device.

SUMMARY

An aspect of the present disclosure is related to a semiconductor device. The semiconductor device comprises a metal oxide semiconductor field effect transistor (MOSFET). The MOSFET comprises a plurality of parasitic silicon controlled rectifier (SCR) equivalent circuits. The MOSFET further comprises a drain region. The drain region comprises a plurality of different P-type heavily doped regions, in which the P-type heavily doped regions are operated as anodes of the SCR equivalent circuits, respectively.

Another aspect of the present disclosure is related to a semiconductor device. The semiconductor device comprises a drain region and a source region. The drain region comprises a plurality of different P-type heavily doped regions, in which the P-type heavily doped regions sequentially and concentrically surround one another. The source region surrounds a peripheral of the drain region.

Still another aspect of the present disclosure is related to a semiconductor device. The semiconductor device comprises a plurality of different patterned semiconductor regions and a plurality of silicon controlled rectifier (SCR) equivalent circuits. The SCR equivalent circuits are parasitized in the semiconductor device. The SCR equivalent circuits comprises a plurality of equivalent PNP-type transistors and an equivalent NPN-type transistor, in which the equivalent PNP-type transistors are formed corresponding to the different patterned semiconductor regions, and the equivalent PNP-type transistors are electrically connected in parallel with one another and electrically connected with the equivalent NPN-type transistor.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of various embodiments, with reference to the accompanying drawings as follows.

DESCRIPTION OF THE EMBODIMENTS

Figure 1:
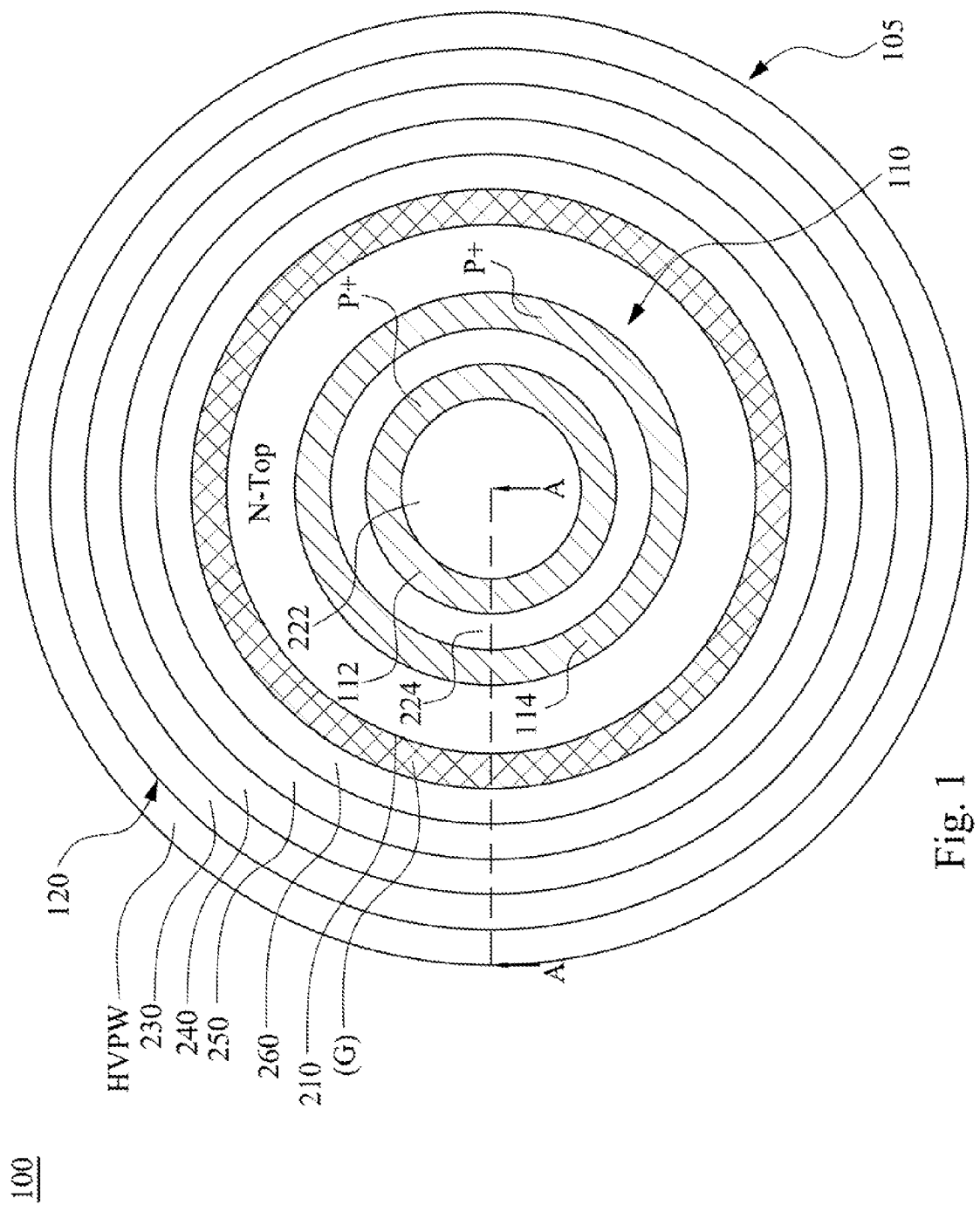
FIG. 1 is a schematic diagram of a layout of a semiconductor device according to a first embodiment of the present disclosure.

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

It will be understood that, although the terms"first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

FIG. 1 is a schematic diagram of a layout of a semiconductor device according to a first embodiment of the present disclosure. For clear illustration, structures related to field oxide layers (FOX) are omitted. The semiconductor device 100 illustrated in FIG. 1 can include an electrostatic discharge (ESD) protection device, or can be operated as the ESD protection device, so as to provide ESD protection mechanism. As illustrated in FIG. 1, the semiconductor device 100 includes a metal oxide semiconductor field effect transistor (MOSFET) 105 (the MOSFET 105 is given only for illustration, and a structure diagram of the MOSFET 105 can be specifically illustrated in FIG. 2A). The MOSFET 105 includes parasitic silicon controlled rectifier (SCR) equivalent circuits (as illustrated in FIG. 3), and the MOSFET 105 includes a drain region 110. Moreover, the drain region 110 includes different P-type heavily doped regions (e.g. P-type heavily doped regions 112 and 114), in which the different P-type heavily doped regions (e.g., P-type heavily doped regions 112 and 114) are operated as anodes of the SCR equivalent circuits, respectively.

In one embodiment, the P-type heavily doped region 114 can surround the P-type heavily doped region 112. In another embodiment, in the condition of the drain region 110 including three or more than three different P-type heavily doped regions, one of the different P-type heavily doped regions may surround another one of the P-type heavily doped regions.

Furthermore, in some embodiments, the different P-type heavily doped regions are not directly connected with one another. In some other embodiments, the different P-type heavily doped regions can be electrically connected with one another through contacts. Specific descriptions can be made with reference to the embodiments illustrated in FIG. 2A.

The "different P-type heavily doped regions" illustrated in the present disclosure may indicate that several P-type heavily doped regions are separately disposed or independently disposed from one another in the semiconductor structure.

Although FIG. 1 merely illustrates two P-type heavily doped regions 112 and 114, it is given for convenient illustration and not limiting of the present disclosure. In other words, one of ordinary skill in the art can use two or more than two P-type heavily doped regions for the aforementioned disposition according to practical needs. Explained in a different way, the layout of the semiconductor device 100 illustrated in FIG. 1 can include two or more than two loops of P-type heavily doped regions, and thus it is not limited to that illustrated in FIG. 1.

In another aspect of embodiments of the present disclosure, the MOSFET 105 includes the drain region 110 and a source region 120, in which the source region 120 surrounds a peripheral of the drain region. The drain region 110 includes different P-type heavily doped regions (e.g., the P-type heavily doped regions 112 and 114), in which the P-type heavily doped regions (e.g., the P-type heavily doped regions 112 and 114) may sequentially and concentrically surround one another. For example, the P-type heavily doped region 114 concentrically surrounds the P-type heavily doped region 112.

Figure 2A:
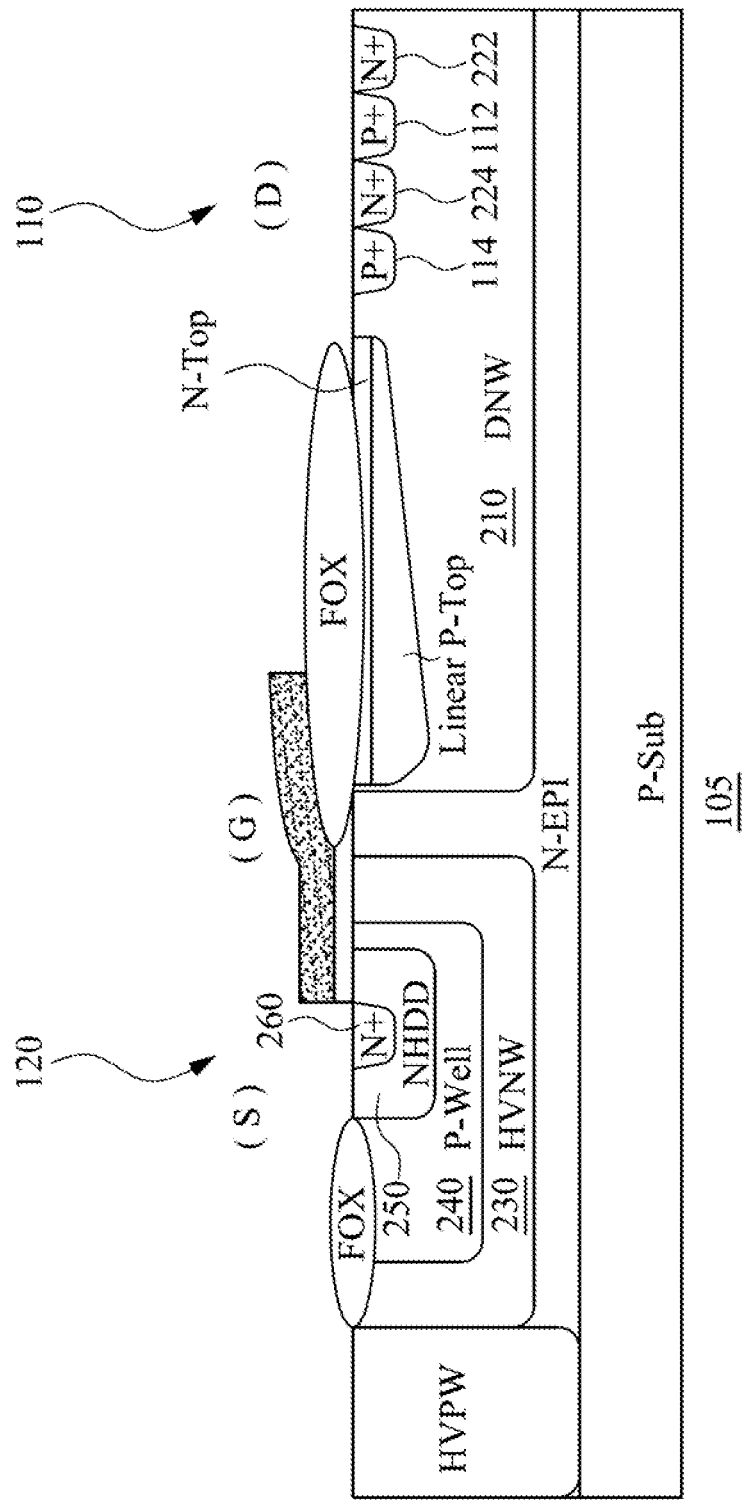
FIG. 2A is a cross-section diagram of the structure along a line A-A in the semiconductor device in FIG. 1 according to one embodiment of the present disclosure.
Figure 3:
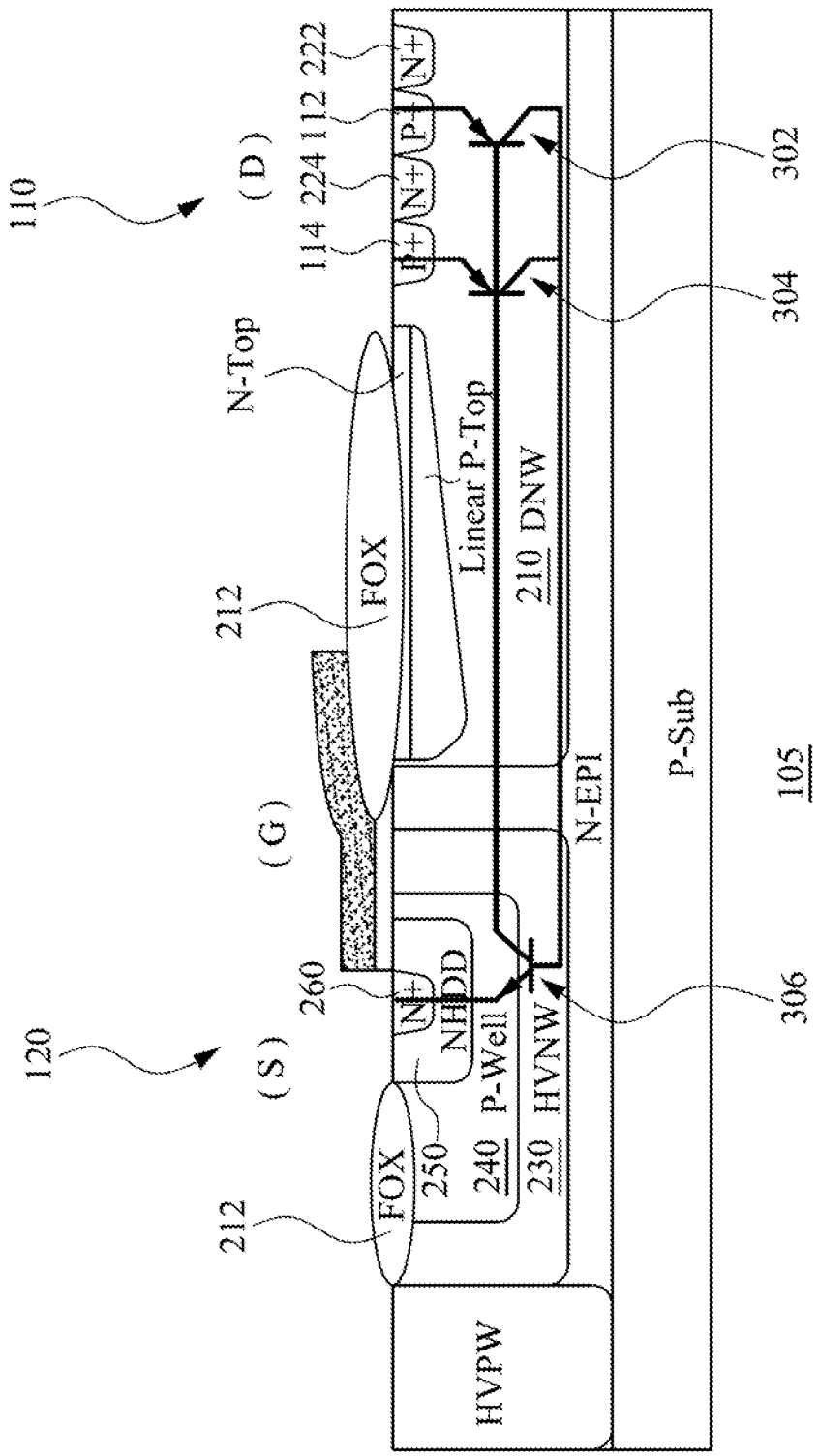
FIG. 3 is a diagram illustrating the parasitic SCR equivalent circuits of the semiconductor device illustrated in FIG. 2A, according to one embodiment of the present disclosure.

FIG. 2A is a cross-section diagram of the structure along a line A-A in the semiconductor device in FIG. 1 according to one embodiment of the present disclosure. For clear and convenient illustration, descriptions are made below with reference to FIG. 1 and FIG. 2A. As illustrated in FIG. 1 and FIG. 2A, the source region 120 (S), gate region (G), and drain region 110 (D) of the MOSFET 105 are laterally formed along the line A-A, in which the P-type heavily doped regions (e.g., the P-type heavily doped regions 112 and 114) are laterally formed in the drain region 110 (D).

Moreover, in one embodiment, as illustrated in FIG. 1 and FIG. 2A, the MOSFET 105 may further include an N-type well region 210 (e.g., an N-type high voltage deep well region DNW) and N-type heavily doped regions (e.g., N-type heavily doped regions 222 and 224), in which the P-type heavily doped regions (e.g., the P-type heavily doped regions 112 and 114) can be formed in the N-type well region 210, and the N-type heavily doped regions 222 and 224 can be disposed in the N-type well region 210, and the N-type heavily doped regions 222 and 224 and the P-type heavily doped regions 112 and 114 can be laterally and alternately disposed.

In addition, as illustrated in FIG. 1 and FIG. 2A, a top-layer N-type doped region labeled as "N-Top" and a linear top-layer P-type doped region labeled as "Linear P-Top" can be included, in which the top-layer N-type doped region "N-Top" and the linear top-layer P-type doped region "Linear P-Top" are formed in the N-type well region 210.

As illustrated in FIG. 2A, in the present embodiment, the P-type heavily doped regions 112 and 114 are separately disposed or independently disposed from one another, and are not directly connected with one another. In other embodiments, the drain region 110 (D) may include a drain contact region (not shown), in which the drain contact region is formed above the P-type heavily doped regions (e.g., the P-type heavily doped regions 112 and 114) and the N-type heavily doped regions (e.g., the N-type heavily doped regions 222 and 224) to be metal contacts of the drain electrode. As a result, the P-type heavily doped regions 112 and 114 can be electrically connected with one another through the contacts.

Moreover, for the entire layout of the semiconductor device 100, the P-type heavily doped region 112 can surround the N-type heavily doped region 222, the N-type heavily doped region 224 can surround the P-type heavily doped region 112, the P-type heavily doped region 114 can surround the N-type heavily doped region 224, and the source region 120 is formed at an outside loop surrounding the P-type heavily doped region 114.

Similarly, although FIG. 2A merely illustrates two N-type heavily doped regions 222 and 224, it is given for convenient illustration with the P-type heavily doped regions 112 and 114, and is not limiting of the present disclosure. In other words, one of ordinary skill in the art can use a corresponding number of N-type heavily doped regions matching the P-type heavily doped regions for the aforementioned disposition, according to practical needs.

On the other hand, the source region 120 of the MOSFET 105 may further include another N-type well region 230 (e.g., a high voltage N-type well region HVNW), a P-type well region 240, an N-type buffer region 250, and an N-type heavily doped region 260. The N-type heavily doped region 260 is formed in the N-type buffer region 250 to be operated as the source electrode of the MOSFET 105. The N-type buffer region 250 is formed in the P-type well region 240. The N-type well regions 210 and 230 can be commonly formed in an N-type epitaxial layer labeled as "N-EPI." Although the P-type well region 240 is labeled as P-Well in the figure, it can be applied with a structure of P-Body in other embodiments.

Figure 2B:
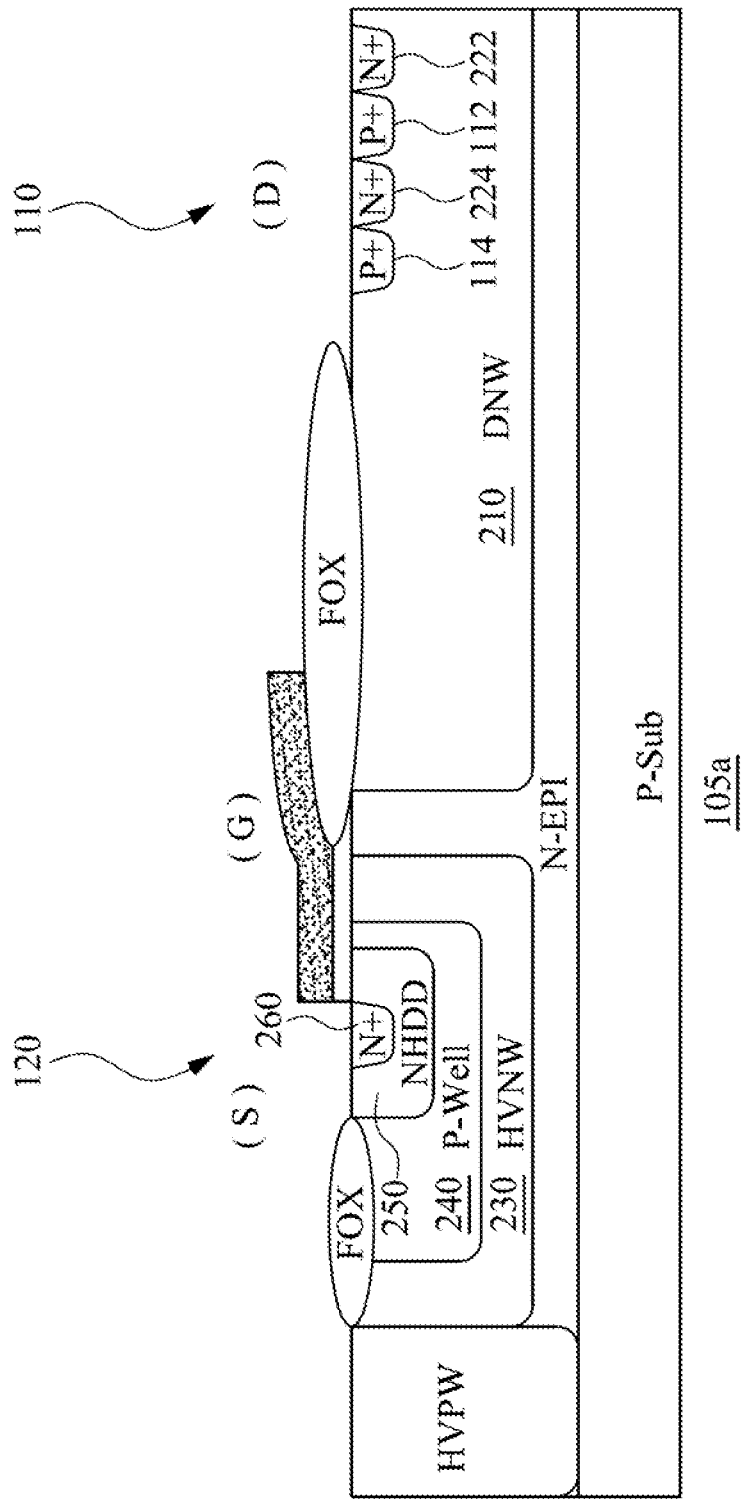
FIG. 2B is a structure diagram of the semiconductor device in FIG. 1, according to another embodiment of the present disclosure.

FIG. 2B is a structure diagram of the semiconductor device in FIG. 1, according to another embodiment of the present disclosure. Compared with the MOSFET 105 in FIG. 2A, in the MOSFET 105a illustrated in FIG. 2B, the top-layer N-type doped region "N-Top" and the linear top-layer P-type doped region "Linear P-Top" can be omitted.

FIG. 3 is a diagram illustrating the parasitic SCR equivalent circuits of the semiconductor device illustrated in FIG. 2A, according to one embodiment of the present disclosure. As can be known from the embodiment in FIG. 3, the four parts, such as the P-type heavily doped region 112, the N-type well region 210 together with the N-type epitaxial layer N-EPI and N-type well region 230, the P-type well region 240, and the N-type buffer region 250 together with the N-type heavily doped region 260, can form semiconductor interfaces of P/N/P/N, and the SCR equivalent circuit with the semiconductor interfaces of P/N/P/N can thus be formed. The three parts, such as the P-type heavily doped region 112, the N-type well region 210 together with the N-type epitaxial layer N-EPI and N-type well region 230, and the P-type well region 240, form an equivalent PNP-type transistor 302. The three parts, such as the N-type well region 210 together with the N-type epitaxial layer N-EPI and N-type well region 230, the P-type well region 240, and the N-type buffer region 250 together with the N-type heavily doped region 260, form an equivalent NPN-type transistor 306. The equivalent PNP-type transistor 302 together with the equivalent NPN-type transistor 306 can form the SCR equivalent circuit.

Similarly, the four parts, such as the P-type heavily doped region 114, the N-type well region 210 together with the N-type epitaxial layer N-EPI and N-type well region 230, the P-type well region 240, and the N-type buffer region 250 together with the N-type heavily doped region 260, can form semiconductor interfaces of P/N/P/N, and the SCR equivalent circuit with the semiconductor interfaces of P/N/P/N can thus be formed. The three parts, such as the P-type heavily doped region 114, the N-type well region 210 together with the N-type epitaxial layer N-EPI and N-type well region 230, and the P-type well region 240, form an equivalent PNP-type transistor 304. The three parts, such as the N-type well region 210 together with the N-type epitaxial layer N-EPI and N-type well region 230, the P-type well region 240, and the N-type buffer region 250 together with the N-type heavily doped region 260, form the equivalent NPN-type transistor 306. The equivalent PNP-type transistor 304 together with the equivalent NPN-type transistor 306 can form the SCR equivalent circuit. The equivalent PNP-type transistor 304 and the equivalent PNP-type transistor 302 are electrically connected in parallel with each other.

Furthermore, the SCR equivalent circuits are parasitized between the drain region 110 (D) and the source region 120 (S), the P-type heavily doped regions 112 and 114 can be operated as anodes of the SCR equivalent circuits, and the N-type heavily doped region 260 can be operated as cathode of the SCR equivalent circuits. In operation, when electrostatic discharge (ESD) occurs, the SCR equivalent circuits formed by the equivalent PNP-type transistors 302 and 304 and the equivalent NPN-type transistor 306 can have a plurality of current conduction paths to conduct the ESD current at the same time, so as to perform ESD protection.

As mentioned above, if the semiconductor device 100 (or the MOSFET 105, or the MOSFET 105a) is an ultra high voltage device and has a sufficient large layout area, multiple loops of different P-type heavily doped regions surrounding one another can thus be disposed. As a result, in the condition of a constant layout area, several different ESD current conduction paths can be formed in the drain region 110 (D). For example, when a human body or an object carrying positive electrostatic charges touches, for instance, the contact of the drain region, the current corresponding to the positive ESD charges can flow through the P-type heavily doped regions (may be operated as the anodes of the SCR equivalent circuits) in the drain region toward a source region. In such condition, it is unnecessary to increase the size of the device, and the device can still have the advantage of having a small volume. At the same time, the ESD current conducted by the device also can be uniformly distributed (for example, the ESD current can be conducted through multiple paths), such that the capability of the device conducting the large ESD current is enhanced, making the semiconductor device be able to perform protection more effectively.

Figure 4:
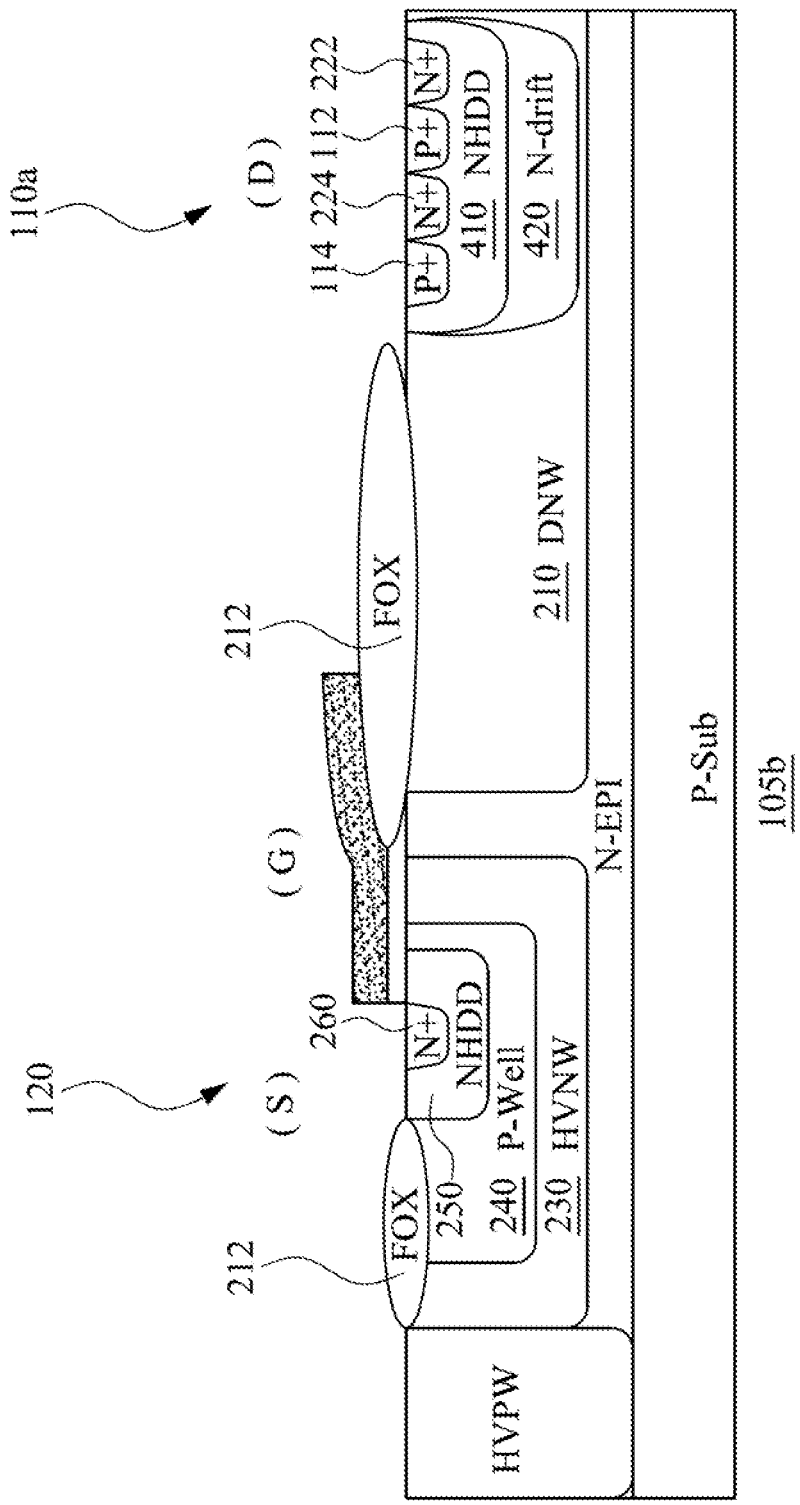
FIG. 4 is a cross-section diagram of the structure along a line A-A in the semiconductor device in FIG. 1, according to another embodiment of the present disclosure.

FIG. 4 is a cross-section diagram of the structure along a line A-A in the semiconductor device in FIG. 1, according to another embodiment of the present disclosure. As illustrated in FIG. 4, compared with the embodiment illustrated in FIG. 2B, the drain region 110a (D) of the MOSFET 105b may further include an N-type buffer region 410 and an N-type drift region 420, in which the P-type heavily doped regions (e.g., the P-type heavily doped regions 112 and 114) and the N-type heavily doped regions (e.g., the N-type heavily doped regions 222 and 224) are formed in the N-type buffer region 410, the N-type buffer region 410 is formed in the N-type drift region 420, and the N-type drift region 420 is formed in the N-type well region 210.

Figure 5:
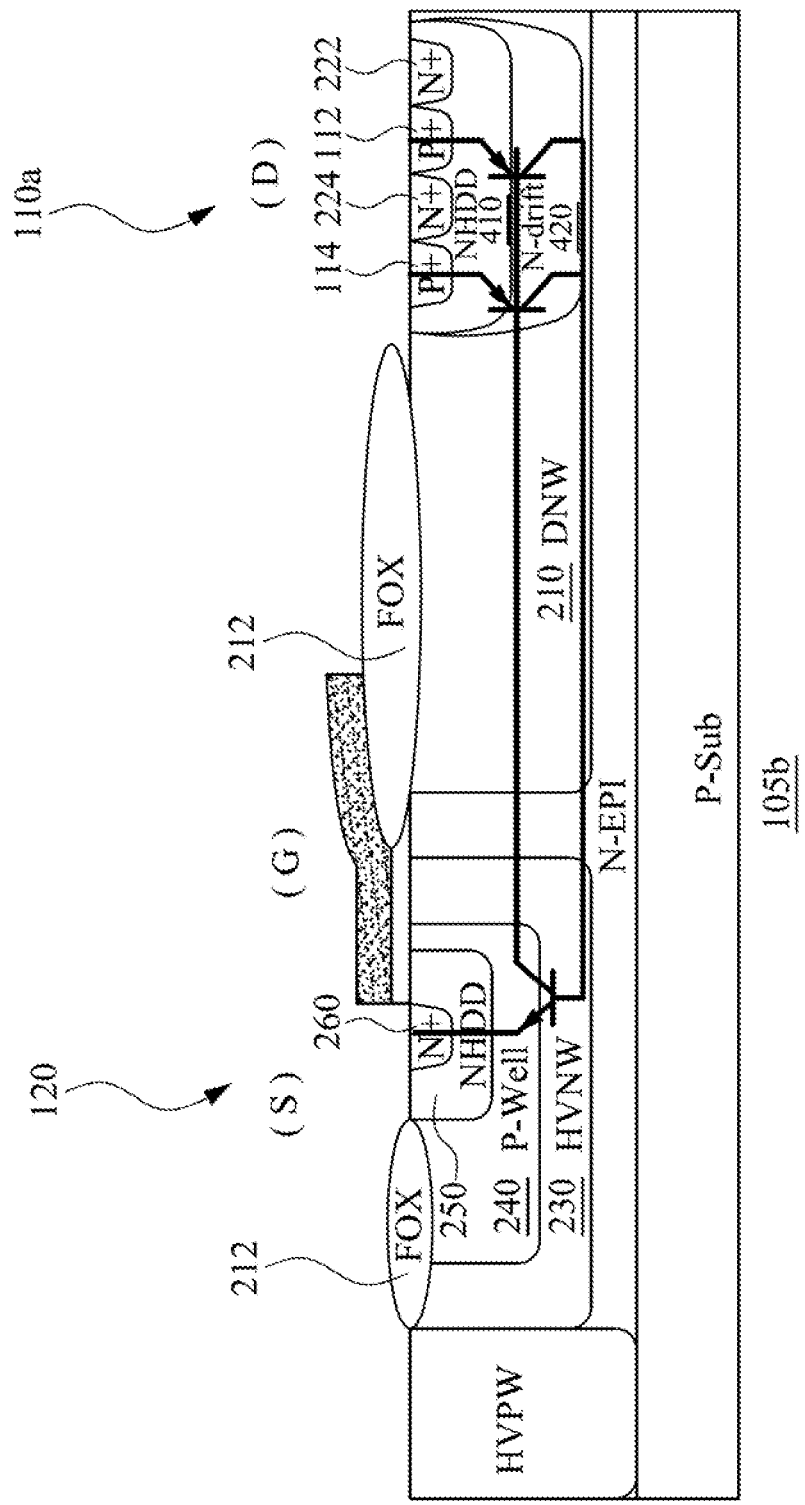
FIG. 5 is a diagram illustrating the parasitic SCR equivalent circuits of the semiconductor device illustrated in FIG. 4, according to one embodiment of the present disclosure.

FIG. 5 is a diagram illustrating the parasitic SCR equivalent circuits of the semiconductor device illustrated in FIG. 4, according to one embodiment of the present disclosure. As can be known from the embodiment in FIG. 5, the P-type heavily doped region 112 is operated as the P-type semiconductor interface, the N-type buffer region 410 together with the N-type drift region 420, the N-type well region 210, the N-type epitaxial layer N-EPI and the N-type well region 230 are operated as the N-type semiconductor interface, the P-type well region 240 is operated as the P-type semiconductor interface, and the N-type buffer region 250 together with the N-type heavily doped region 260 are operated as the N-type semiconductor interface, so as to form the semiconductor interfaces of P/N/P/N, and the SCR equivalent circuit can thus be formed.

Similarly, the P-type heavily doped region 114 is operated as the P-type semiconductor interface, the N-type buffer region 410 together with the N-type drift region 420, the N-type well region 210, the N-type epitaxial layer N-EPI and the N-type well region 230 are operated as the N-type semiconductor interface, the P-type well region 240 is operated as the P-type semiconductor interface, and the N-type buffer region 250 together with the N-type heavily doped region 260 are operated as the N-type semiconductor interface, so as to form the semiconductor interfaces of P/N/P/N, and the SCR equivalent circuit can thus be formed.

In some embodiments, the drain regions can be formed with W-shape, U-shape, a single loop of elliptical spiral, a plurality of loops of elliptical spirals, or other shapes. The following descriptions are made, for example, with reference to FIGS. 6A-6F, but the embodiments of the present disclosure are not limited thereto.

Figure 6A:
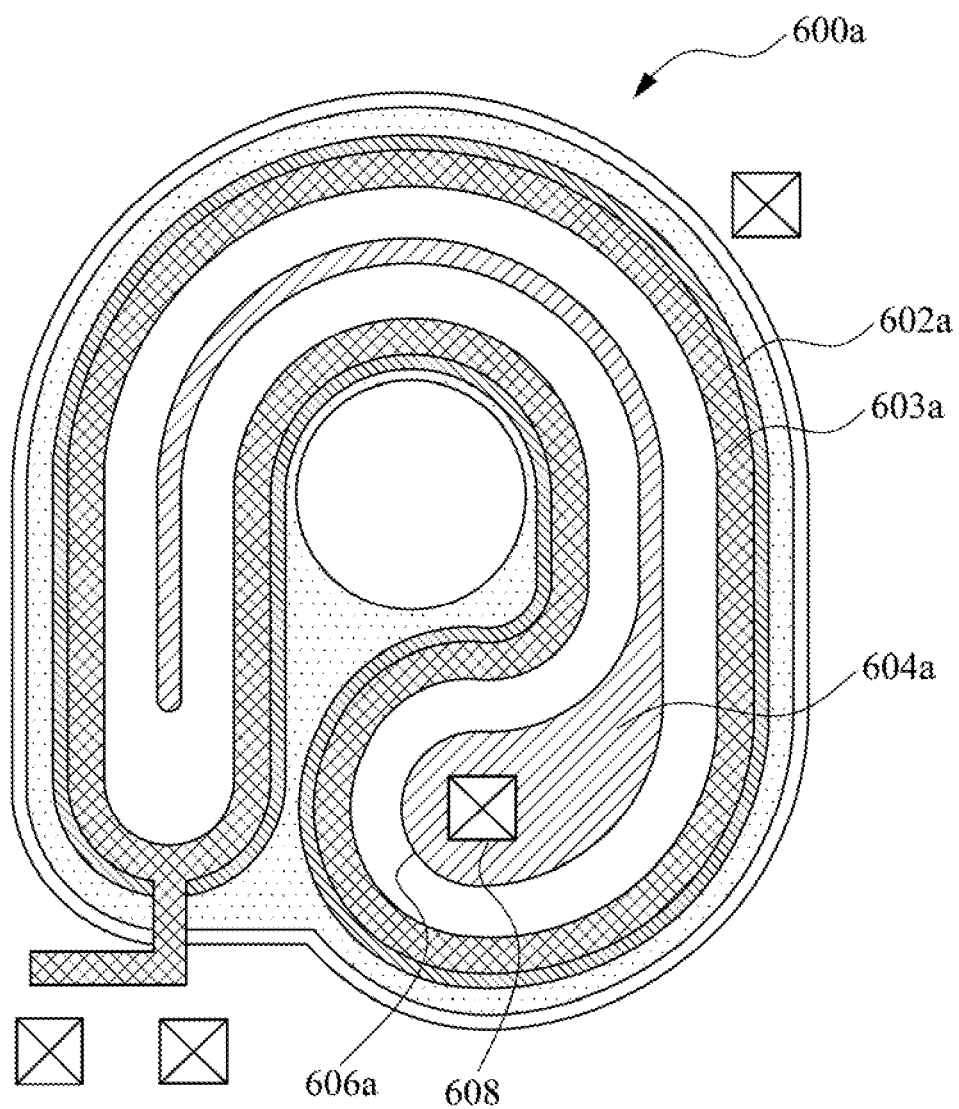
FIG. 6A illustrates top view of a metal oxide semiconductor field effect transistor having a single-looped elliptical spiral-shaped drain with a water drop-shaped starting portion according to one embodiment of the present disclosure.

FIG. 6A illustrates a top view of a metal oxide semiconductor field effect transistor having a single-looped elliptical spiral-shaped drain with a water drop-shaped starting portion according to one embodiment of the present disclosure. The MOSFET 600a includes a source region 602a, a gate region 603a and a drain region 604a. For the structure of the MOSFET 600a, the drain region 604a is formed with the shape of elliptical spiral, and a starting portion 606a of the drain region 604a is formed with a water drop shape, the contact window 608 is electrically connected with the starting portion 606a of the drain region 604a of elliptical spiral. Moreover, the P-type heavily doped regions 112 and 114 and the N-type heavily doped regions 222 and 224 illustrated in FIG. 1 can be formed with the same or similar elliptical spiral, and are formed in the drain region 604a, and sequentially surround one another (which is similar to the disposition illustrated in FIG. 1).

Figure 6B:
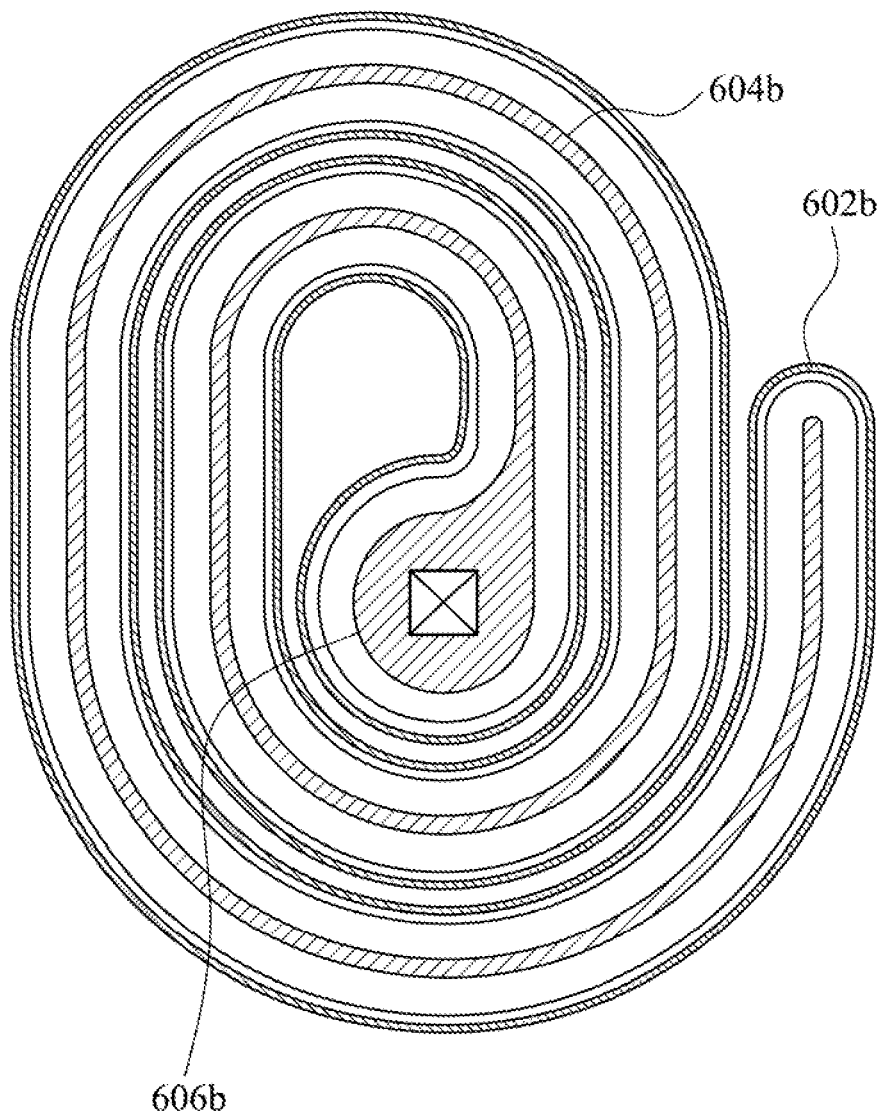
FIG. 6B illustrates a top view of a metal oxide semiconductor field effect transistor having a multiple-looped elliptical spiral-shaped drain with a water drop-shaped starting portion according to one embodiment of the present disclosure.

FIG. 6B illustrates a top view of a metal oxide semiconductor field effect transistor having a multiple-looped elliptical spiral-shaped drain with a water drop-shaped starting portion according to one embodiment of the present disclosure. Similarly, the source region 602b and the drain region 604b are illustrated in FIG. 6B. In the present embodiment, the starting portion 606b of the drain region 604b is still formed with a water drop shape, and the drain region 604b is formed with multiple loops of elliptical spiral. Furthermore, the P-type heavily doped regions 112 and 114 and the N-type heavily doped regions 222 and 224 illustrated in FIG. 1 can be formed with the same or similar elliptical spiral, and are formed in the drain region 604b, and sequentially surround one another (which is similar to the disposition illustrated in FIG. 1).

Figure 6C:
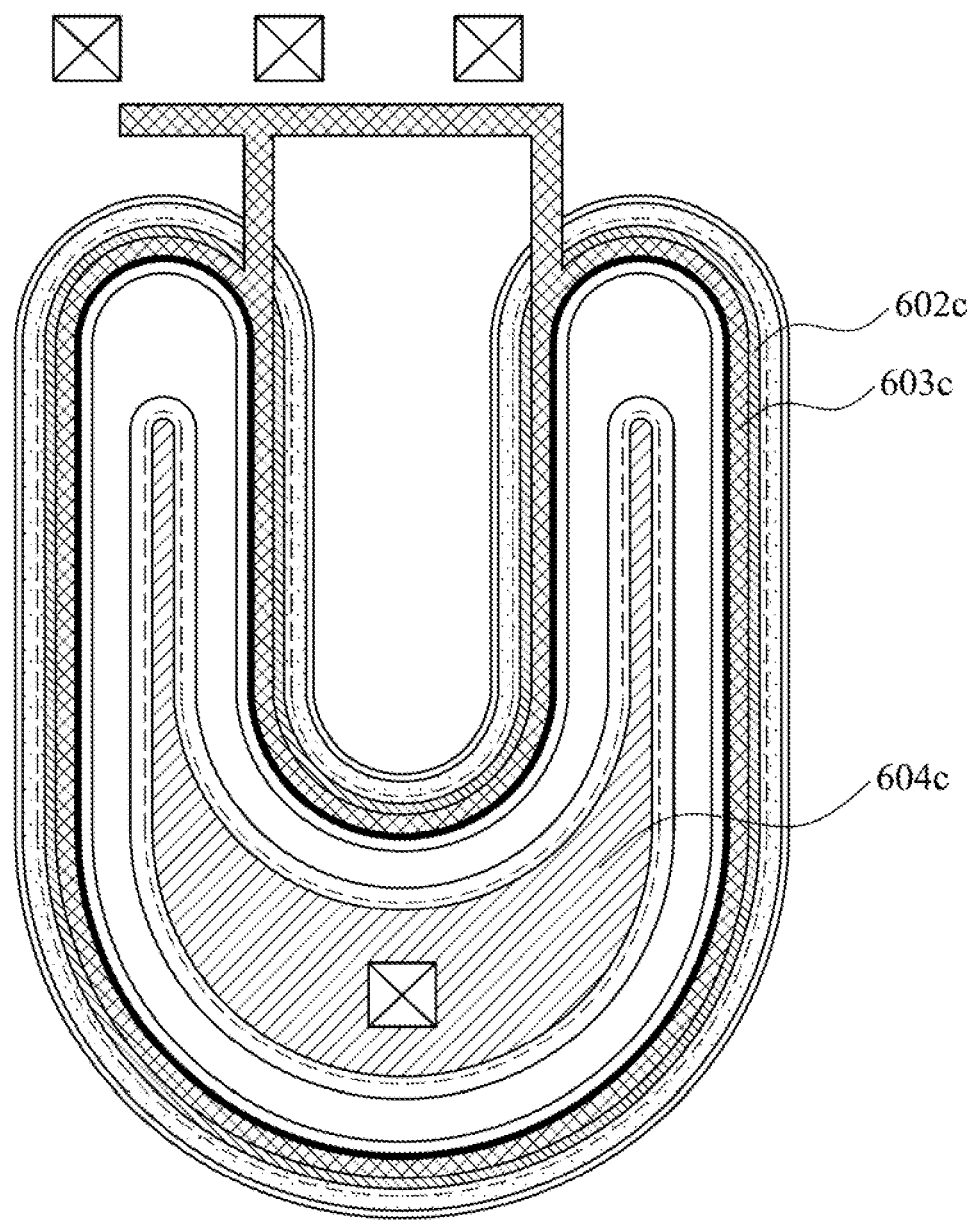
FIG. 6C illustrates a top view of a U-shaped metal oxide semiconductor field effect transistor according to one embodiment of the present disclosure.

FIG. 6C illustrates a top view of a U-shaped metal oxide semiconductor field effect transistor according to one embodiment of the present disclosure. Similarly, the source region 602c, the gate region 603c, and the drain region 604c are illustrated in FIG. 6C. In the present embodiment, the drain region 604c is formed with U-shape. Furthermore, the P-type heavily doped regions 112 and 114 and the N-type heavily doped regions 222 and 224 illustrated in FIG. 1 can be formed with the same or similar U-shape, and are formed in the drain region 604c, and sequentially surround one another (which is similar to the disposition illustrated in FIG. 1).

Figure 6D:
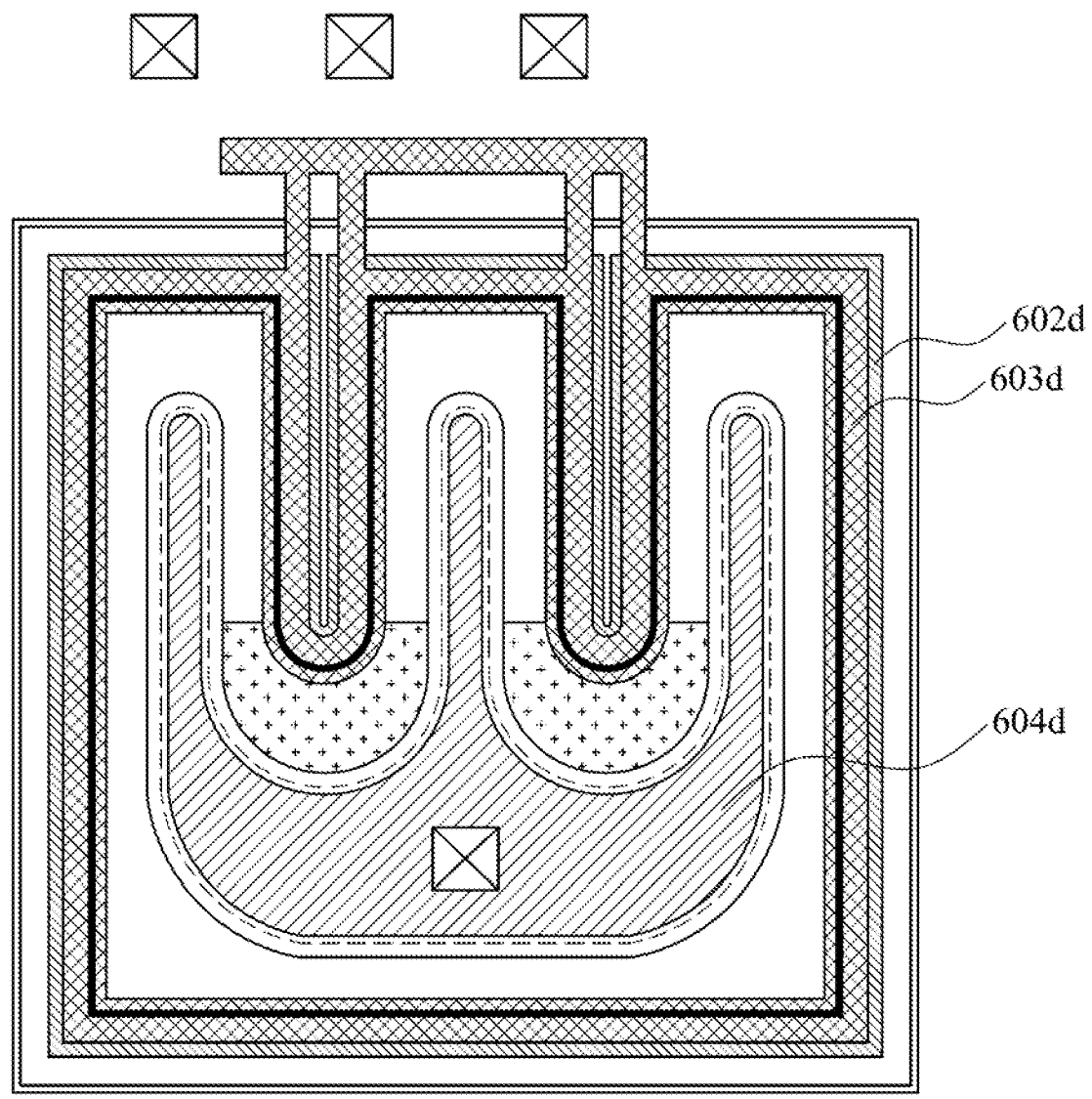
FIG. 6D illustrates a top view of a W-shaped metal oxide semiconductor field effect transistor according to one embodiment of the present disclosure.

FIG. 6D illustrates a top view of a W-shaped metal oxide semiconductor field effect transistor according to one embodiment of the present disclosure. Similarly, the source region 602d, the gate region 603d, and the drain region 604d are illustrated in FIG. 6D. In the present embodiment, the drain region 604d can be seen as (but not limited to) the structure made from the portion with U-shape in FIG. 6A and combining two U-shaped portions into a similar W-shape (or called an E-shape in different view). The P-type heavily doped regions 112 and 114 and the N-type heavily doped regions 222 and 224 illustrated in FIG. 1 are formed with the same or similar W-shape, and are formed in the drain region 604d, and sequentially surround one another (which is similar to the disposition illustrated in FIG. 1).

Figure 6E:
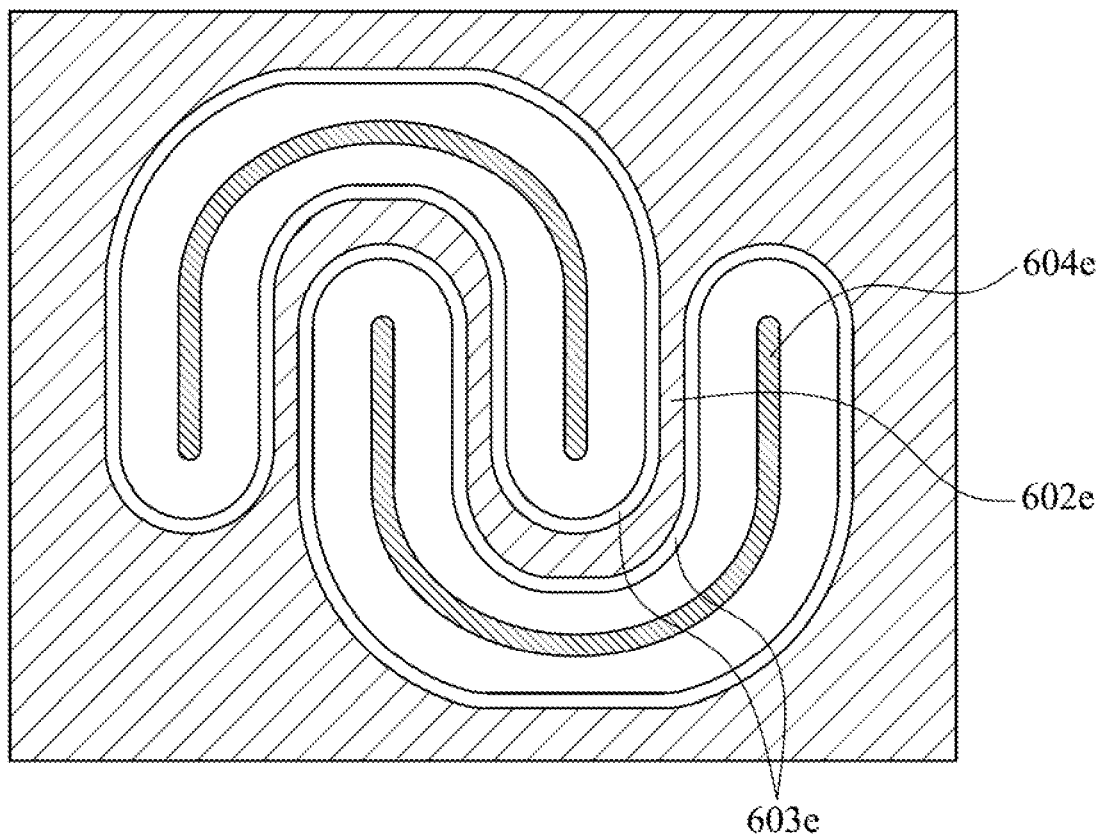
FIG. 6E illustrates a top view of a pair-shaped metal oxide semiconductor field effect transistor according to one embodiment of the present disclosure.

FIG. 6E illustrates a top view of a pair-shaped metal oxide semiconductor field effect transistor according to one embodiment of the present disclosure. Similarly, the source region 602e, the gate region 603e, and the drain region 604e are illustrated in FIG. 6E. In the present embodiment, the drain region 604e can be seen as (but not limited to) the structure made from the portion with U-shape in FIG. 6A and pairing two U-shaped portions. The P-type heavily doped regions 112 and 114 and the N-type heavily doped regions 222 and 224 illustrated in FIG. 1 are formed in the drain region 604e and sequentially surround one another (which is similar to the disposition illustrated in FIG. 1).

Figure 6F:
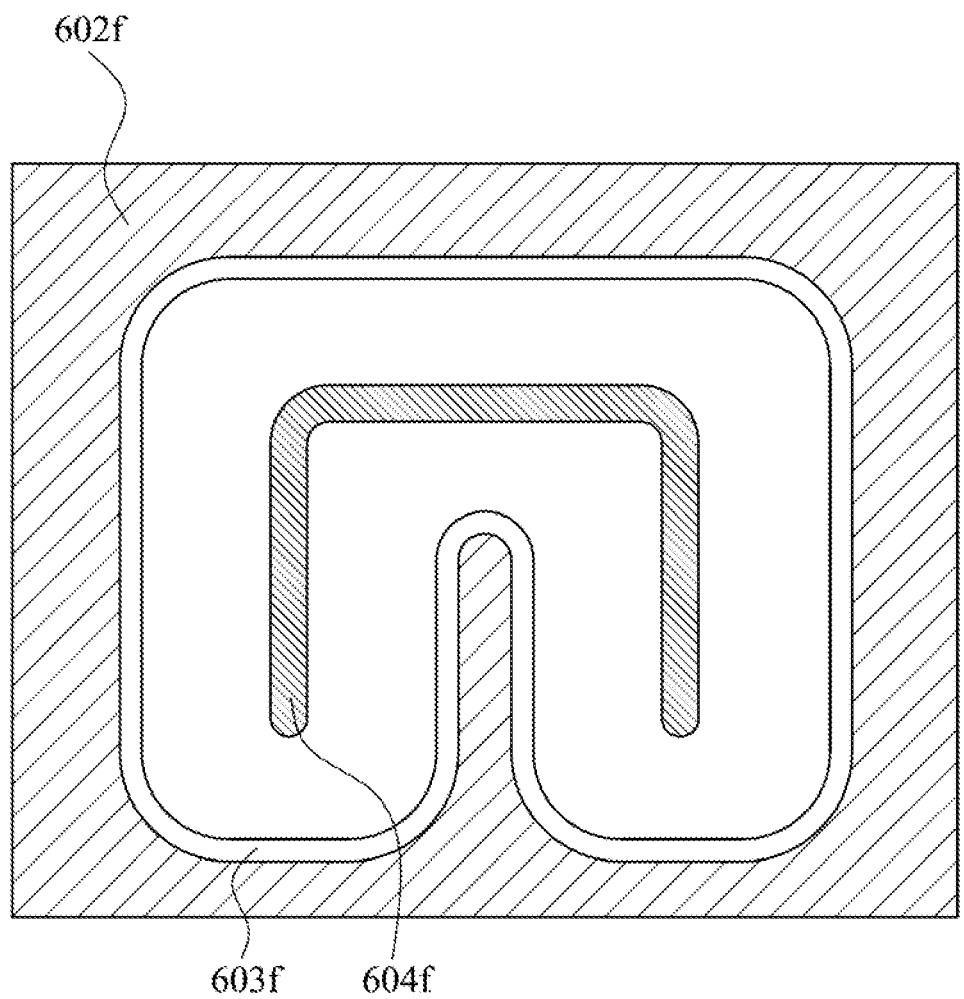
FIG. 6F illustrates a top view of a finger-shaped metal oxide semiconductor field effect transistor according to one embodiment of the present disclosure.

FIG. 6F illustrates a top view of a finger-shaped metal oxide semiconductor field effect transistor according to one embodiment of the present disclosure. Similarly, the source region 602f, the gate region 603f, and the drain region 604f are illustrated in FIG. 6F. In the present embodiment, the drain region 604f can be seen as (but not limited to) the structure made from the portion with U-shape in FIG. 6A. The P-type heavily doped regions 112 and 114 and the N-type heavily doped regions 222 and 224 illustrated in FIG. 1 are formed in the drain region 604f, and sequentially surround one another (which is similar to the disposition illustrated in FIG. 1).

On the other hand, in practice, the P-type heavily doped regions can be circular patterned semiconductor regions (e.g., the embodiment in FIG. 1), elliptical patterned semiconductor regions, finger-shaped patterned semiconductor regions, or pair-shaped patterned semiconductor regions, or patterned semiconductor regions with other shapes, which are different from one another and are formed in the way similar to the embodiment in FIG. 1, included within the spirit and scope of the appended claims. In other embodiments, in view of the top view diagram, multiple P-type heavily doped regions can also be formed in the drain region 110, and shapes of the P-type heavily doped regions projected onto a base surface of the MOSFET present an island distribution. The island distribution of the P-type heavily doped regions can be regular or irregular, and each of the P-type heavily doped regions can be rectangular, triangular or the combinations of other shapes. The P-type heavily doped regions can be formed in the N-type doped region in the drain region, in which the N-type doped region can be, for example, the N-type well region 210 in FIG.

2A, or the N-type buffer region 410 in FIG. 5. The P-type heavily doped regions can be operated as the anodes of the parasitic SCR equivalent circuits in the semiconductor device, so as to form multiple SCR equivalent circuits which are electrically connected in parallel.

Figure 7:
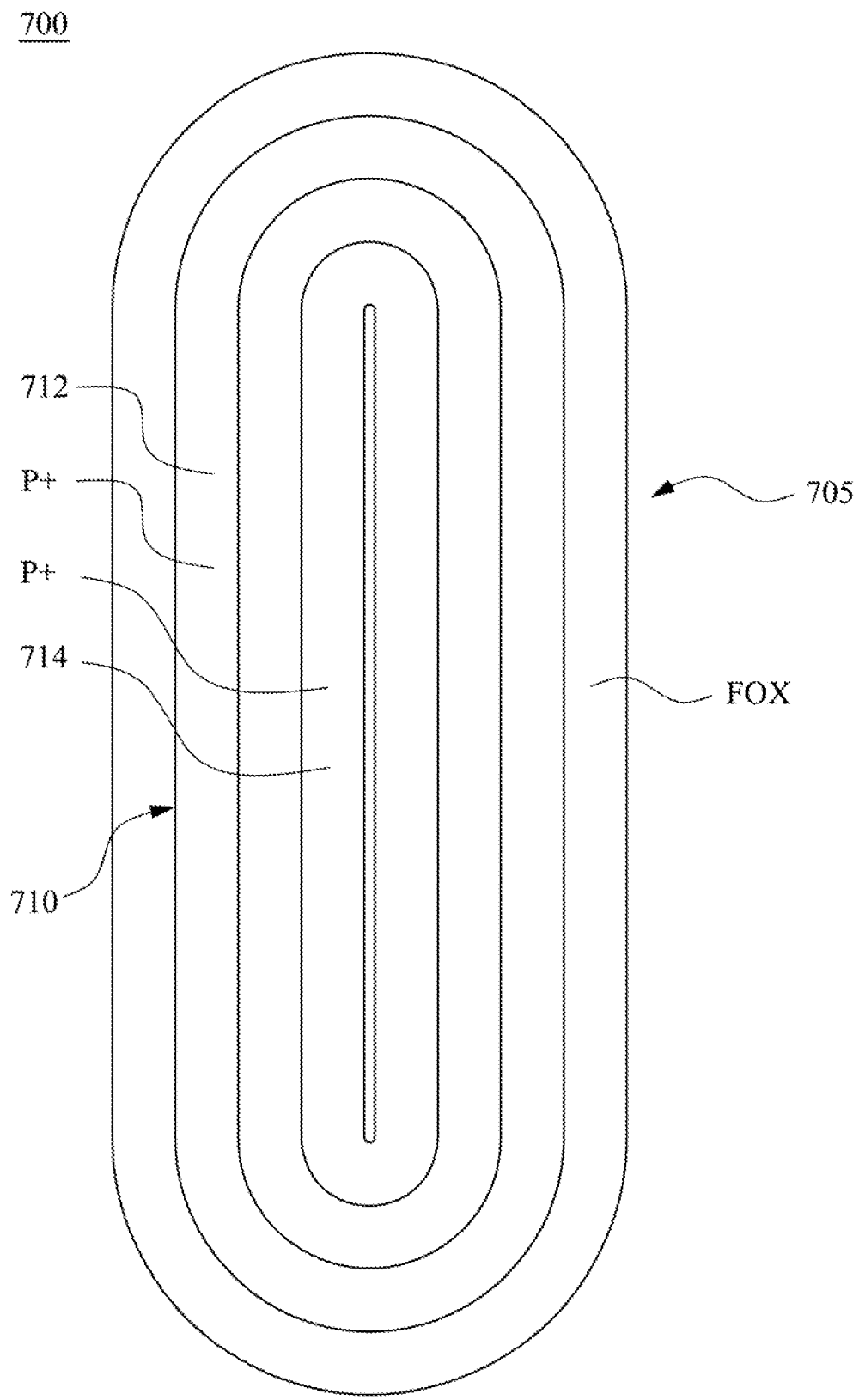
FIG. 7 is a schematic diagram of a layout of a semiconductor device according to a second embodiment of the present disclosure.

FIG. 7 is a schematic diagram of a layout of a semiconductor device according to a second embodiment of the present disclosure. For clear illustration, FIG. 7 illustratively shows the portions related to field oxide layers (FOX) and the drain region. As illustrated in FIG. 7, the semiconductor device 700 includes a MOSFET 705 (the MOSFET 705 herein is given for illustrative purposes), the MOSFET 705 has parasitic SCR equivalent circuits, and the MOSFET 705 includes a drain region 710. In addition, the MOSFET 705 includes multiple different elliptical patterned P-type heavily doped regions (e.g., P-type heavily doped regions 712 and 714), in which the different P-type heavily doped regions (e.g., P-type heavily doped regions 712 and 714) can be operated as anodes of the SCR equivalent circuits, respectively, and the different P-type heavily doped regions (e.g., P-type heavily doped regions 712 and 714) can sequentially and concentrically surround one another (for example, the P-type heavily doped region 712 concentrically surrounds the P-type heavily doped region 714), so as to form multiple loops of P-type heavily doped regions.

The cross-sectional structure of the MOSFET 705 in the present embodiment and the operations and diagrams of the corresponding various embodiments thereof are similar to those illustrated in FIGS. 2-5, and thus they are not further detailed.

Moreover, in the condition that the different P-type heavily doped regions are finger-shaped patterned semiconductor regions or patterned semiconductor regions with other shapes, the different P-type heavily doped regions similarly can sequentially and concentrically surround one another, as illustrated above, so as to form multiple loops of P-type heavily doped regions, and thus they are not further detailed.

On the other hand, as can be known from the embodiments illustrated in FIG. 2A and FIG. 3, in still another aspect of the embodiments of present disclosure, the semiconductor device includes a plurality of different patterned semiconductor regions (e.g., the P-type heavily doped regions 112 and 114) and a plurality of SCR equivalent circuits, in which the SCR equivalent circuits are parasitized in the semiconductor device, each of the SCR equivalent circuits includes equivalent PNP-type transistors (e.g., the equivalent PNP-type transistors 302 and 304) and an equivalent NPN-type transistor (e.g., the equivalent NPN-type transistor 306). The equivalent PNP-type transistors (e.g., the equivalent PNP-type transistors 302 and 304) are formed corresponding to the different patterned semiconductor regions (e.g., the P-type heavily doped regions 112 and 114), and the equivalent PNP-type transistors (e.g., the equivalent PNP-type transistors 302 and 304) are electrically connected in parallel with one another and electrically connected with the equivalent NPN-type transistor (e.g., the equivalent NPN-type transistor 306).

In one embodiment, the patterned semiconductor regions (e.g., the P-type heavily doped regions 112 and 114) are circular patterned semiconductor regions, elliptical patterned semiconductor regions, finger-shaped patterned semiconductor regions, or pair-shaped patterned semiconductor regions, which are different from one another, and the patterned semiconductor regions (e.g., the P-type heavily doped regions 112 and 114) sequentially and concentrically surround one another.

Table I shown below indicates breakdown voltages of the MOSFET 105 having 0 (configuration 0), 1 (configuration 1), or 2 (configuration 2) P-type heavily doped regions, applied in FIG. 2A, and the collector current (Id) generated when 20 V is applied to the gate electrode. The configuration 2 has passed the HBM (human body mode) test in the condition that positive electrostatic charge of 8 KV is applied, and its breakdown voltage can still be maintained above 800 V. The dopant dosage of the linear top-layer P-type doped region "Linear P-Top" is approximately $1.40E+13/cm^2$, and the dopant dosage of the top-layer N-type doped region "N-Top" is approximately $2.00E+12/cm^2$, and the test result is shown as Table I.

TABLE I

| | dopant dosage of Linear P-Top | dopant dosage of N-Top | BVD (breakdown voltage) | Id (collector current) |
|---|---|---|---|---|
| Configuration 0 | 1.40E+13 | 2.00E+12 | 861 | 4.02E−07 |
| Configuration 1 | 1.40E+13 | 2.00E+12 | 845 | 4.10E−07 |
| Configuration 2 | 1.40E+13 | 2.00E+12 | 850 | 4.11E−07 |

The features related to shapes and structures of the semiconductor regions can be individually formed and can also be formed together. Thus, the aforementioned embodiments are given only for convenient illustrative purposes to describe respective features, and all of the embodiments can be selectively combined according to practical needs, in order to manufacture the semiconductor device in the present disclosure, and thus they are not limiting of the present disclosure.

For the embodiments of the present disclosure, the semiconductor device in the present disclosure can form multiple different ESD current conduction paths in the drain region under the condition of a constant layout area, such that it is unnecessary to increase the size of the device and the device can still have the advantage of having a small volume. At the same time, the ESD current conducted by the device also can be uniformly distributed, such that the capability of the device conducting the large ESD current is enhanced, making the semiconductor device be able to perform protection more effectively.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A semiconductor device comprising:
    a metal oxide semiconductor field effect transistor (MOSFET) comprising a plurality of parasitic silicon controlled rectifier (SCR) equivalent circuits, wherein the MOSFET further comprises:
    a drain region comprising:
        an N-type well region;
        a plurality of different P-type heavily doped regions disposed in the N-type well region, wherein the P-type heavily doped regions are operated as anodes of the parasitic SCR equivalent circuits in the drain region, respectively; and
        a plurality of N-type heavily doped regions disposed in the N-type well region, the N-type heavily doped regions and the P-type heavily doped regions being laterally and alternately disposed.

2. The semiconductor device as claimed in claim 1, wherein one of the P-type heavily doped regions surrounds another one of the P-type heavily doped regions.

3. The semiconductor device a claimed in claim wherein the P-type heavily doped regions sequentially and concentrically surround one another.

4. The semiconductor device as claimed in claim 1, wherein the P-type heavily doped regions comprise circular patterned semiconductor regions, elliptical patterned semiconductor regions, finger-shaped patterned semiconductor regions, or pair-shaped patterned semiconductor regions, which are different from one another.

5. The semiconductor device as claimed in claim wherein the P-type heavily doped regions are not directly connected with one another.

6. The semiconductor device as claimed in claim 1, wherein the P-type heavily doped regions e electrically connected with one another through contacts.

7. The semiconductor device as claimed in claim 1, wherein the MOSFET further comprises:
 an N-type buffer region, the P-type heavily doped regions and the N-type heavily doped regions formed in the N-type buffer region; and
 an N-type drift region, the N-type buffer region formed in the N-type drift region, the N-type drift region formed in the N-type well region.

8. The semiconductor device as claimed in claim 1, wherein shapes of the P-type heavily doped regions projected onto a base surface of the MOSFET present an island distribution.

9. The semiconductor device as claimed in claim 1, wherein when the anodes have positive electrostatic charges, a current corresponding to the positive electrostatic charges flow through the parasitic SCR equivalent circuits in the drain region from the P-type heavily doped regions toward a source region.

10. A semiconductor device comprising:
 a drain region comprising:
  an N-type well region;
  a plurality of different P-type heavily doped regions disposed in the N-type well region; and
  a plurality of N-type heavily doped regions disposed in the N-type well region, the N-type heavily doped regions and the P-type heavily doped regions being laterally and alternately disposed;
 wherein a plurality of different patterned semiconductor regions comprise the plurality of P-type heavily doped regions and the plurality of N-type heavily doped regions; and
 a plurality of silicon controlled rectifier (SCR) equivalent circuits parasitized in the semiconductor device, the SCR equivalent circuits comprising a plurality of equivalent PNP-type transistors, wherein the equivalent PNP-type transistors are formed corresponding to the different patterned semiconductor regions, and the equivalent PNP-type transistors are electrically connected in parallel with one another and electrically connected with an equivalent NPN-type transistor of the SCR equivalent circuits in a source region.

11. The semiconductor device as claimed in claim 10, wherein the patterned semiconductor regions comprise circular patterned semiconductor regions, elliptical patterned semiconductor regions, finger-shaped patterned semiconductor regions, or pair-shaped patterned semiconductor regions, which are different from one another, and the patterned semiconductor regions sequentially surround one another.

12. The semiconductor device as claimed in claim 10, wherein the plurality of P-type heavily doped regions of the patterned semiconductor regions are not directly connected with one another.

13. The semiconductor device as claimed in claim 10, wherein the patterned semiconductor regions are electrically connected with one another through contacts.

14. The semiconductor device as claimed in c lain 10, wherein when electrostatic discharge (ESD) occurs, the equivalent PNP-type transistors and the equivalent NPN-type transistor form a plurality of current conduction paths to conduct a current corresponding to the electrostatic discharge.

* * * * *